United States Patent [19]
Pfiester et al.

[11] Patent Number: 4,811,066
[45] Date of Patent: Mar. 7, 1989

[54] COMPACT MULTI-STATE ROM CELL

[75] Inventors: James R. Pfiester; Frank K. Baker, both of Austin, Tex.

[73] Assignee: Motorola, Inc., Schaumburg, Ill.

[21] Appl. No.: 109,658

[22] Filed: Oct. 19, 1987

[51] Int. Cl.⁴ .................. H01L 29/48; G11C 11/34
[52] U.S. Cl. .................. 357/23.5; 357/23.12; 357/23.14; 357/59; 357/86; 365/184
[58] Field of Search ............ 357/23.12, 23.5, 23.14, 357/86, 59; 365/184

[56] References Cited

U.S. PATENT DOCUMENTS

| | | | |
|---|---|---|---|
| 3,855,610 | 12/1974 | Masuda et al. | 357/59 |
| 3,938,174 | 2/1976 | Sano | 357/23 |
| 4,543,595 | 9/1985 | Vora | 357/86 |

FOREIGN PATENT DOCUMENTS

| | | | |
|---|---|---|---|
| 56-33881 | 4/1981 | Japan | 357/23.12 |
| 60-98675 | 6/1985 | Japan | 357/23.12 |

Primary Examiner—Andrew J. James
Assistant Examiner—Jerome Jackson
Attorney, Agent, or Firm—John A. Fisher

[57] ABSTRACT

A compact, multi-state field effect transistor (FET) cell having a gate with edge portions of a different conductivity type than a central portion of the gate. Both the edge portions and the central portion extend from the source to the drain of the multi-state FET device. This device would have two different threshold voltages ($V_T$), one where the central portion would turn on first, followed by the edges for the entire gate width to be active to give a second level of current flow. Such devices would be useful in building very compact or high density multi-state read-only-memories (ROMs).

11 Claims, 5 Drawing Sheets

COMPACT MULTI-STATE ROM CELL

FIELD OF THE INVENTION

The invention relates to insulated gate field effect transistors (FETs), sometimes called metal-oxide-semiconductor (MOS) transistors, and more particularly relates to insulated gate FETs that have gate possessing portions of a first conductivity type adjacent portions of a second conductivity type.

BACKGROUND OF THE INVENTION

Read-only-memories (ROMs) are well known in the semiconductor art, and are programmed during processing by generating a special interconnect (metal, contact, doped polycrystalline silicon, etc.) mask which corresponds to the data to be stored on the chips. The data or program is essentially "hard-wired" into the integrated circuit structure and cannot be changed after fabrication is completed.

ROM technology is characterized by the fact ROM chips can be produced in a short turn-around time. That is, the time that a customer orders a ROM chip with a particular set of data or program to the time the chip is delivered is relatively short as compared with other integrated circuit chips since the programming can take place late in the process. Further, ROM chips can be made with high density which provides low cost per bit of storage. Additionally, ROMs provide memories with short access times.

It is known that one goal in ROM technology is to increase the density of the memory by storing more than a simple binary quantity in each bit. Instead of each bit having simply an "on" and an "off" state, each cell would have several "on" states and one "off" state. Each "on" state corresponds to a different level of current during a read operation. Such cells are called multi-state ROM cells.

It is understood that multi-state ROM cells have been proposed using cell elements of different geometries. However, such cells have disadvantages in that in their fabrication, the critical dimensions, or smallest resolvable dimensions of the process, must be tightly controlled to provide such geometric devices to be precisely made. Further, with this approach, programming must be done fairly early in the IC fabrication and thus the turn-around time would be lengthened, which is an additional disadvantage. Some multi-state ROM cells also consume considerable lateral substrate space, which is also a disadvantage in high density integrated circuits.

SUMMARY OF THE INVENTION

Accordingly, it is an object of the present invention to provide a new multi-state ROM cell.

Another object of the invention is to provide a multi-state ROM cell that is compact and does not laterally consume substrate area.

It is another object of the present invention to provide a compact, multi-state ROM cell that does not require tight critical dimension control during fabrication.

A further object of the present invention is to provide a compact, multi-state ROM cell that can be programmed relatively late in the fabrication sequence.

In carrying out these and other objects of the invention, there is provided, in one form, an insulated gate field effect transistor (IGFET) having a semiconductor substrate of a first conductivity type and a source and a drain region in the semiconductor substrate. The source and drain regions are of a second conductivity type and are separated by a channel in the semiconductor substrate. A thin dielectric layer is present on the semiconductor substrate overlying at least the channel. A gate of semiconductor material overlies the thin dielectric layer and the channel wherein the gate comprises at least two regions extending between the source and the drain. The first of the regions is of the first conductivity type and the second of the regions is of the second conductivity type.

It will be appreciated that the proportions of the elements of the ROM cell depicted in FIGS. 1 and 5 through 8 are not to scale and may be exaggerated, particularly with respect to thickness, for the sake of clarity.

DETAILED DESCRIPTION OF THE INVENTION

The inventors have discovered that a compact, multi-state ROM cell may be provided by controlling the effective width of the devices, rather than the effective length, and by utilizing the differing work functions of n+ vs. p+ polycrystalline silicon (polysilicon) gates to control the effective channel width at a given gate voltage. Although a four-state cell is described extensively herein, it will be appreciated by those skilled in the art that a cell with greater or fewer states than these may be readily designed using the structures and methods of this invention. For an n-channel MOS FET with a n+ polysilicon gate, the threshold voltage, $V_T$, is approximately 1 V lower as compared with the case of an n-channel MOS FET with a p+ polysilicon gate.

Figure 3:
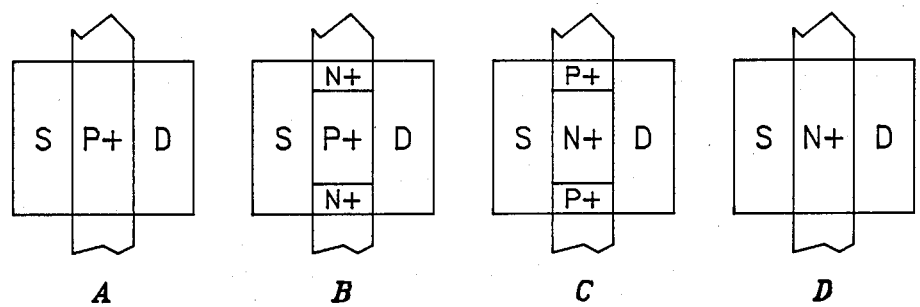
FIG. 3 is an illustrative depiction of four FETs with different states.

Shown in FIG. 3 is a continuum of four cells with different read currents for $V_{T_0}$ being less than or equal to $V_G$. Case A, where the gate is entirely p+, corresponds to the "off" state. Case B, where there is a small portion of the p+ gate that is n+, would use low current as its read state. Case C, where there is a relatively larger portion of the gate as n+, which is depicted as the reverse of case B, would use an intermediate current for its "on" state, whereas case D where the entire gate is n+, would require high current for its "on" state.

Figure 1:
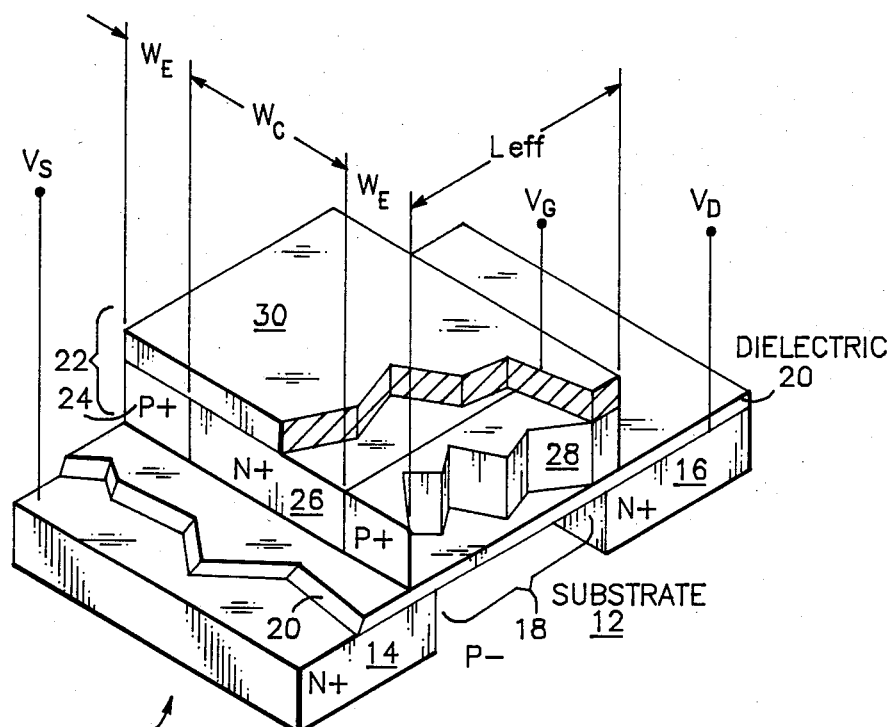
FIG. 1 is a partial, schematic, isometric view of the compact, multi-state ROM cell of the present invention.

Shown in FIG. 1 is the inventive integrated circuit field effect transistor (FET) 10 which includes a semiconductor substrate 12, which includes, but is not limited to, monocrystalline silicon, which is doped with one impurity type, such as a light dose of boron for p−. Substrate 12 has a first region of opposite conductivity type or source 14 and a second region of opposite conductivity type or drain 16, both doped n+, such as with phosphorus or arsenic. It will be appreciated that the structures and processes of the present invention are compatible with the provision of lightly doped drains (LDDs) and graded source/drains (GSDs) in the FET. Source 14 and drain 16 are separated from one another by channel 18 which is covered by thin dielectric layer 20. Thin dielectric layer 20 serves as the gate dielectric for FET 10, and is typically, but not limited to, silicon dioxide. Positioned on gate dielectric layer 20 over channel 18 is gate 22.

Figure 2:
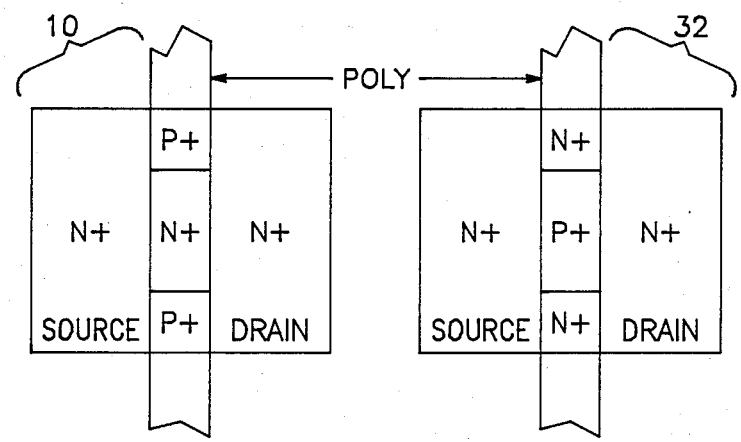
FIG. 2 is a schematic, overhead, layout view of a complementary MOS (CMOS) implementation of the present invention.

Gate 22 should have at least two regions extending between the source 14 and drain 16 in the direction parallel to the channel 16, in other words, the direction the carriers would travel from the source 14 to the drain 16 through the channel 16. These two regions should have different conductivity types; one should be n-type and the other should be p-type. In the particular embodiment shown in FIG. 1, gate 22 has three regions, a central region 26, and first edge region 24 and second edge region 28. In this embodiment, central gate region 26 is doped n+ and edge regions 24 and 28 are doped p+. FIG. 2 illustrates another embodiment where in FET 32 the center portion of the gate is p+ and the edge portions are n+. Since p/n junctions are formed at the joints of regions 24, 26 and 28, a conductive material strap 30 is probably necessary to ensure the same $V_g$ across the entire gate 22. Conductive material strap 30 may be any suitable material, such as a metal, for instance aluminum; a doped semiconductor material, such as doped polysilicon; or a refractory metal silicide, such as tantalum, cobalt, titanium or tungsten silicide. However, some silicides, like tantalum silicide have been reported to permit the rapid diffusion of the impurities in the doped polysilicon that they come into contact with, under certain thermal annealing conditions. Such silicides would permit rapid cross-diffusion from the end portions 24 and 28 into the central portion 26 and vice versa. In short order, the entire gate 22 would have only one controlling impurity concentration and the multi-state function of the cell 10 would be impossible. Thus, such silicides should not be used. It will also be appreciated that the conductivity types of gate 22 shown in FIG. 1 can be reversed from that shown therein without seriously affecting the performance of the FET.

Figure 4:
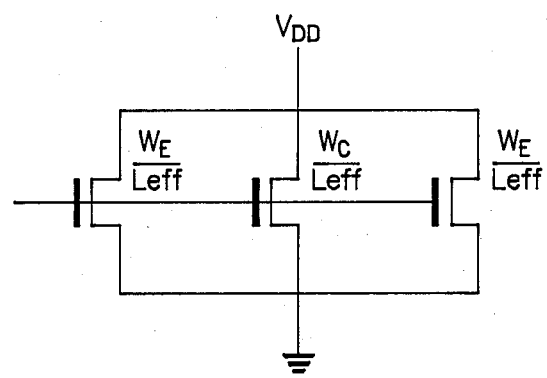
FIG. 4 is an equivalent circuit diagram of the compact, multi-state ROM cell of FIG. 1.

Also shown in FIG. 1 is the effective length of the cell, $L_{eff}$, the widths of the edge portions 24 and 28, $W_e$, ad the width of the central portion 26, $W_c$. Cell 10 can be represented by the equivalent circuit of three transistors shown in FIG. 4. For the "central transistor", $V_T=V_{T_0}$, while for the "edge transistors" $V_T=V_{T_0}+1V$, where $V_{T_0}$ is the $V_T$ under the n+ polysilicon gate region. Thus, due to the work function difference between using n+ and p+ polysilicon gates, the $V_T$ of the edge device with $W_e$ will be approximately 1V higher than the center device with $W_c$. It should be remembered that the full width of the p+ gate is 2 $W_e$ and that the total width of the gate 22 is $W_c+2 W_e$.

Generally, the fabrication involves using a masked polysilicon implantation to obtain the proper $W_c$ and $W_e$ values. The polysilicon implant would be aligned to the active region, and $W_c$ could be determined by critical dimension (CD) control of the mask depending upon the implementation chosen. The edge devices would operate simultaneously. The device is relatively insensitive to misalignment, as long as an edge device occurs on both edges. The sum of the two $W_e$ values should be constant even though the individual $W_e$ values may vary. To increase the $V_T$ difference, additional channel implantation could be performed, but this would result in higher junction capacitances, higher body effect and lower field-effect mobility.

Figure 5:
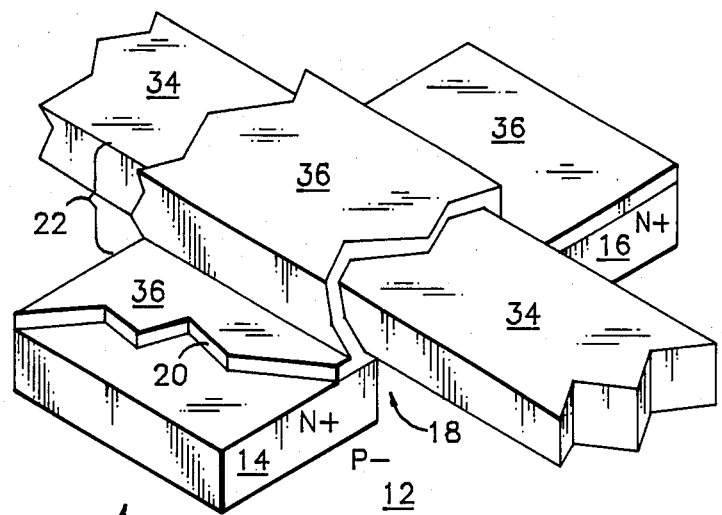
FIG. 5 is a partial, schematic isometric view of a compact, multi-state ROM cell of the present invention under construction showing an undoped polycrystalline silicon gate.

One method of fabrication of such a FET 10 is shown in FIGS. 5 through 8. Similar reference numerals for those employed in FIG. 1 will be used for clarity. FIG. 5 shows a p− semiconductor substrate 12 having a FET 10 formed therein which has n+ source 14 and drain 16 regions in the semiconductor substrate surface 12 separated by channel 18. Over channel 18 has already been formed a gate dielectric layer 20, such as a thin layer of silicon dioxide. A semiconductor material has been formed and patterned to form the gate lines 34, which forms gate 22 over channel 18. The gate line 34 material may be undoped polycrystalline silicon, for instance. Gate line 34 is covered by thin dielectric layer 36, which again may be silicon dioxide or other suitable material.

Figure 6:
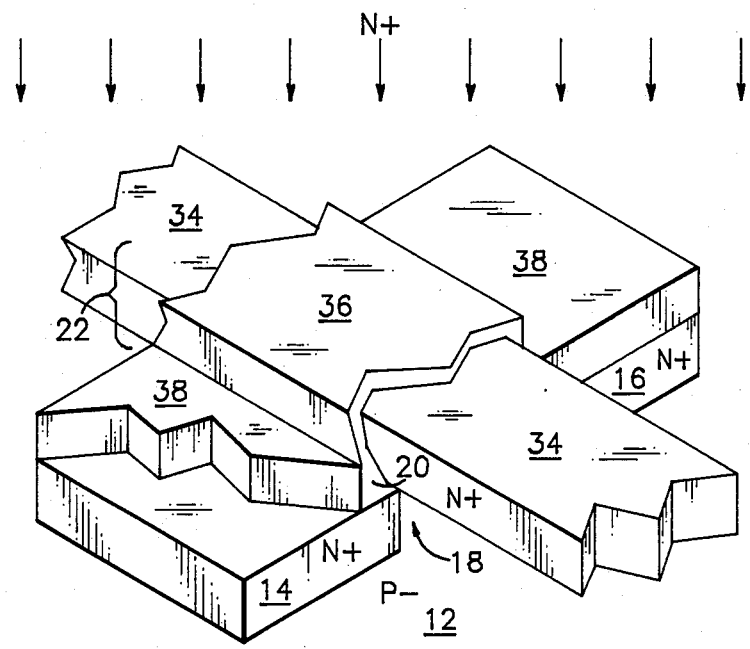
FIG. 6 is another illustration of the cell of FIG. 3 after a differential oxide growth step during ion implantation.

From the condition shown in FIG. 5, a differential oxide growth (DOG) is performed. This is a known process whereby silicon dioxide is formed by a steam oxidation, but due to the heavy n-type doping in the substrate 12 at the source/drain regions 14 and 16, the oxide layer 38 grows appreciably faster there. Since gate line 34 is undoped polysilicon, the oxide growth is much less rapid. After the DOG step, the wafer is subjected to a n+ implant as shown in FIG. 6 by the arrows. Source 14 and drain 16 regions are protected by thick oxide 38, but gate line 34 is subjected to the implant since its layer 36 is relatively much thinner. Thus, gate line 34 and gate 22 are now doped n+ polycrystalline silicon.

Figure 7:
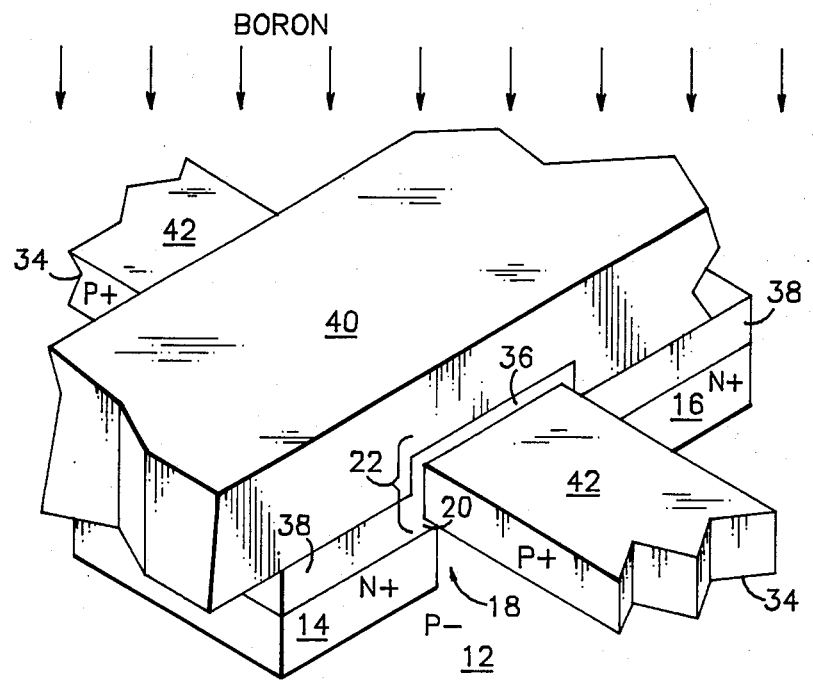
FIG. 7 is a further illustration of the cell of FIG. 4 during a masked ion implantation into the polysilicon line connected to the gate.

The next step is to counterdope selected gates with the opposite impurity to some limited transverse extent, relative to the direction of current flow. As shown in FIG. 7, a photoresist mask 40 is provided over the active regions, including source 14, drain 16 and gate 22. However, the remainder of gate line 34, particularly the sections 42 near gate 22, would be exposed to the boron p+ implant. Thus, these exposed portions of gate line 34 would be counterdoped p+, as shown. In other devices, the mask 40 need not be present if it is desired that the entire gate be counterdoped p+.

Figure 8:
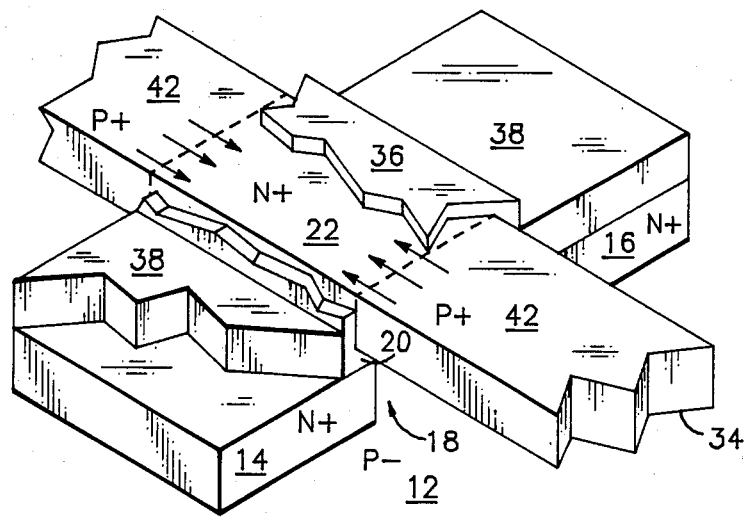
FIG. 8 is an additional illustration of the compact, multi-state ROM of the present invention from FIG. 5 illustrating how the edges of the gate may be counter-doped.

As shown in FIG. 8, an anneal is performed next to diffuse the p+ impurity from the side portions 42 of gate line 34 transversely into gate 22 to form the p+ end portions 24 and 28 shown in FIG. 1. The anneal should not be extended so long in time or so high in temperature that the p+ impurity completely counterdopes gate 22. Some central portion 26 should remain n+ as shown in FIG. 1. This high temperature cycle must be designed to allow for dopant diffusion in the silicon substrate as well, diffusion that will affect source, drain and, if present, channel profiles.

Subsequently, thin dielectric layer 36 should be removed, such as by a wet HF acid or a dry plasma etch and silicide layer 30 may be placed on gate 22 to strap together end portions 24 and 28 and central portion 26 to give the structure shown schematically in FIG. 1. It will be appreciated that dopants are known to diffuse rapidly in some silicides such as tantalum silicide under extreme thermal annealing conditions. However, it has been reported that rapid diffusion of dopants in silicides such as titanium silicide and other silicides is not a problem under the proper annealing conditions. It will be appreciated that the compact, multi-state insulated gate FET of the present invention could be made by other procedures than the process presented here, which is simply one way the device might be made.

For example, in an n-channel MOS (NMOS) process, the FET of the present invention could be made by a modification of the above-described process. Undoped polysilicon could be formed and the gates could be defined to produce a structure such as that shown in FIG. 5. The photoresist over the gate could be retained during the source/drain implant. After the resist is stripped, a DOG anneal would give a structure such as that shown in FIG. 6. Simply, a differential oxide growth (DOG) process involves the growth through steam oxidation of silicon dioxide over a doped and an undoped surface. The oxide over the doped surface grows at a rate appreciably faster than the growth rate over the undoped surface. Then, a masked n+ polysilicon gate implantation step could be performed to introduce n+ dopant only into the central portion 26 of the gate, and the photoresist mask would be stripped afterward. A second DOG anneal could be performed to grow a thick oxide layer over only the central portion 26 of the gate 22 and a non-selective $BF_2$ (p+) polysilicon implantation would dope the rest of polysilicon line 34 as well as the gate edge portions 24 and 28.

In another alternative, the polysilicon implantation steps could also be performed prior to the polysilicon gate definition using the masking photoresist for arsenic and a DOG process to obtain self-aligned $BF_2$ implantations. However, it is felt that a technique to dope gates after the source/drain implantation would result in faster ROM turn-around time for wafer fabrication.

Variations on each of these proposed fabrication processes can be constructed to make CMOS ROMs. For example, in a process similar to the first one discussed above, the p+ polysilicon implantation mask could be incorporated into the p+ p-channel source/drain mask to avoid an extra masking step or implantation step. The $BF_2$ or boron p+ source/drain implantation dose would be higher than the arsenic source/drain implantation dose to allow for p+ compensation of n+ polysilicon for the NMOS edges of the novel gates.

Further, a process similar to the second NMOS process discussed above could be implemented for CMOS, except that a hard mask would be required to protect the polysilicon from the n+ source/drain implantation.

Figure 9:
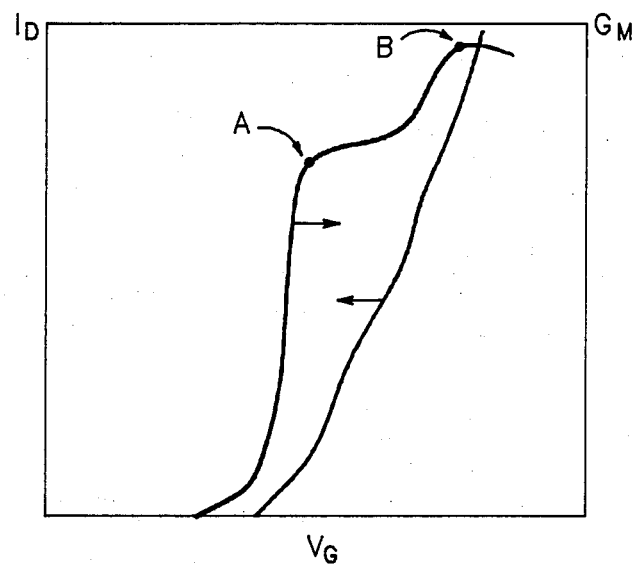
FIG. 9 is a qualitative, theoretical plot of the $I_D$ and $G_m$ as a function of $V_g$ performance of the device of the invention.

The turn-on characteristics of the device of the invention would look similar to those qualitatively portrayed in FIG. 9. The first transconductance, $G_m$, "peak" occurs at point A, where only the low $V_T$ center region device ($W_c$) is conducting. The second $G_m$ "peak" occurs at point B, where the edges with higher $V_T$ turn on as well which increases the effective width of the device to $W = W_c + 2W_e$. The approach of this invention does not depend on channel doping to obtain different $V_T$ regions and therefore the mobility in the channel region is not degraded.

Figure 10:
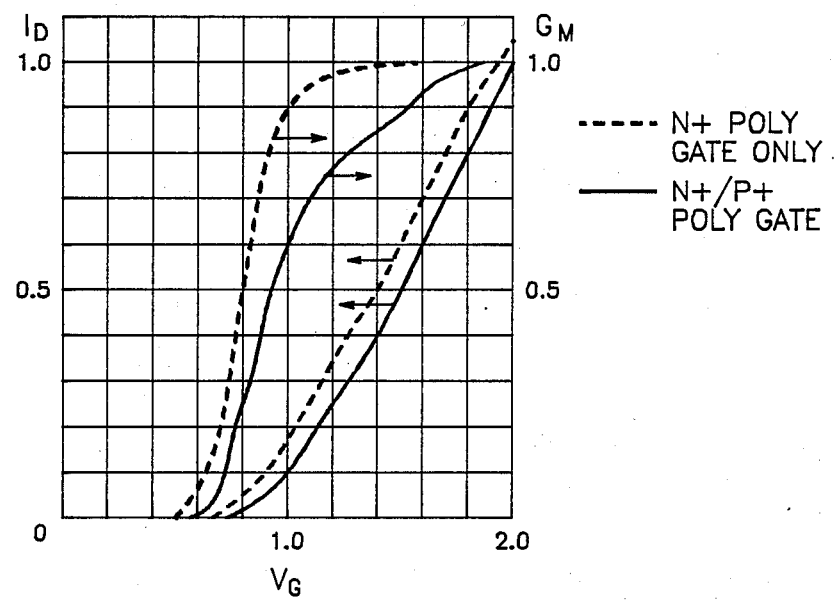
FIG. 10 is a quantitative plot of the $I_D$ and $G_m$ as a function of $V_g$ for a prototype, non-optimized device of the present invention.

An experiment was conducted to fabricate a gate such as gate 22 shown in FIG. 1. The arsenic source/drain dose was 5E15 atoms/cm$^2$ at 70 keV. Using an active area mask, n+ poly was selectively implanted with a boron p+ p+ counterdoping dose of 5E15 atoms/cm$^2$ at 45 keV $BF_2$. The boron was transversely diffused into the gate during a 650° C., 1 hour anneal, followed by a 15 minute at 900° C. nitrogen anneal. The structure was then strapped with titanium silicide. The turn-on characteristics were plotted in FIG. 10, which are normalized $I_D$ and $G_m$ for a 1/50 L/W (length to width ratio). The dashed curves correspond to an n+ poly gate only as the reference device, whereas the solid curves correspond to the inventive gate with the p-type polysilicon on the gate edges. A $W_e$ of equal to about 0.1 microns (um) was deduced from electrical data.

The $G_m$ "peak" values were measured for points A and B for various drawn narrow width n-channel FETs, thus confirming the double peak behavior predicted. No degradation in the low-field field effect mobility value was observed as expected. Although the p+ dose is somewhat lower than would be desired for an optimum device, it does demonstrate the multi-state behavior of the device. Thus, the IGFET of the present invention does exhibit the expected multi-state functionality.

Thus, the insulated gate FET of the present invention provides multiple "on" states for a single cell. The number of states is limited by noise margins and tradeoffs with cell size, die size and sensing abilities. Such a FET is relatively immune to alignment and critical dimension (CD) control problems during fabrication. Programming of selected FETs can also be accomplished before the contacts are defined relatively late in fabrication for more rapid turn-around. Additionally, since the threshold voltages for the various FETs are set by the polysilicon work function, carrier mobility is not degraded and the device can provide relatively higher performance than a device with the $V_T$ altered by a channel implant. Further, since the FET is compact, the FET can be used as a ROM cell in a high density ROM chip that provides low cost per bit.

We claim:

1. An insulated gate field effect transistor (IGFET) comprising:
   a semiconductor substrate of a first conductivity type;
   a source region and a drain region in the semiconductor substrate, the source and drain regions being of a second conductivity type and separated by a channel in the semiconductor substrate;
   a thin dielectric layer on the semiconductor substrate overlying at least the channel;
   a gate electrode of semiconductor material overlying the thin dielectric layer and the channel wherein the gate electrode comprises ohmically connected central, first edge, and second edge regions each traversing the entire channel length between the source and drain and with the first and second edge regions of opposite conductivity type to the central region.

2. The IGFET of claim 1 wherein the first and second edge regions of the gate are of the first conductivity type and the central region is of the second conductivity type.

3. The IGFET of claim 1 wherein the regions of the gate are strapped together by a conductive material.

4. The IGFET of claim 3 wherein the conductive material is a refractory metal silicide.

5. A compact, multi-state read-only-memory (ROM) cell comprising:
   a semiconductor substrate of a first conductivity type;
   a source region and a drain region in the semiconductor substrate, the source and drain regions being of a second conductivity type and separated by
   a channel in the semiconductor substrate;
   a thin dielectric layer on the semiconductor substrate overlying at least the channel; and
   a gate of semiconductor material overlying the thin dielectric layer and the channel wherein the gate comprises a central region and first and second edge regions on either side of the central region extending the entire channel length between the source and the drain, wherein the first and second edge regions are of a different conductivity than the central region, and wherein the gate regions are electrically connected.

6. The compact, multi-state ROM cell of claim 5 wherein the first and second edge regions of the gate are of the first conductivity type and the central region is of the second conductivity type.

7. The compact, multi-state ROM cell of claim 5 wherein the regions of the gate are strapped together by a conductive material.

8. The compact, multi-state ROM cell of claim 7 wherein the conductive material is a refractory metal silicide.

9. The compact, multi-state ROM cell of claim 5 wherein the cell has at least two on states.

10. A compact, multi-state read-only-memory (ROM) cell comprising:
    a semiconductor substrate of a first conductivity type;
    a source region and a drain region in the semiconductor substrate, the source and drain regions being of a second conductivity type and separated by
    a channel in the semiconductor substrate;
    a thin dielectric layer on the semiconductor substrate overlying at least the channel;
    a gate of semiconductor material overlying the thin dielectric layer and the channel wherein the gate comprises a central region and first and second edge regions on either side of the central region extending the entire channel length between the source and the drain, wherein the central region is of the second conductivity type and the first and second edge regions are of the first conductivity type; and a refractory metal silicide strap on the gate ohmically interconnecting the central and edge portions of the gate.

11. The compact, multi-state ROM cell of claim 10 wherein the cell has at least two on states.

* * * * *